United States Patent
Musch et al.

(10) Patent No.: US 8,841,973 B2
(45) Date of Patent: Sep. 23, 2014

(54) CIRCUIT ARRANGEMENT FOR GENERATION OF RADIO FREQUENCY OUTPUT SIGNALS WHICH FORM A BROADBAND FREQUENCY RAMP

(75) Inventors: Thomas Musch, Bochum (DE); Nils Pohl, Bochum (DE)

(73) Assignee: KROHNE Messtechnik GmbH, Duisburg (DE)

( * ) Notice: Subject to any disclaimer, the term of this patent is extended or adjusted under 35 U.S.C. 154(b) by 0 days.

(21) Appl. No.: 13/519,024

(22) PCT Filed: Aug. 22, 2011

(86) PCT No.: PCT/EP2011/004209
§ 371 (c)(1),
(2), (4) Date: Jun. 25, 2012

(87) PCT Pub. No.: WO2012/031684
PCT Pub. Date: Mar. 15, 2012

(65) Prior Publication Data
US 2012/0268215 A1    Oct. 25, 2012

(30) Foreign Application Priority Data
Aug. 22, 2010 (DE) .......................... 10 2010 035 243

(51) Int. Cl.
*H03L 7/00* (2006.01)
*H03L 7/185* (2006.01)
*H03L 7/23* (2006.01)

(52) U.S. Cl.
CPC ............. *H03L 7/185* (2013.01); *H03L 2207/12* (2013.01); *H03L 7/235* (2013.01); *H03L 2207/05* (2013.01)

USPC .................. 331/18; 331/16; 331/34; 455/260

(58) Field of Classification Search
CPC ............ H03D 7/161; H03C 3/40; H03C 1/52; H03C 3/00; H03C 3/0925; H03C 3/0933; H03C 5/00; H03L 7/06; H03L 7/185
USPC ........ 331/16, 1 A, 18; 332/127, 128; 455/260
See application file for complete search history.

(56) References Cited

U.S. PATENT DOCUMENTS 3,696,422 A    10/1972 Burrell
4,160,973 A    7/1979 Berlin, Jr.
(Continued)

FOREIGN PATENT DOCUMENTS

DE        100 65 657 A1    7/2002
DE    10 2004 032 130 A1    2/2006

*Primary Examiner* — Arnold Kinkead
(74) *Attorney, Agent, or Firm* — Roberts Mlotkowski Safran & Cole, P.C.; David S. Safran (57) ABSTRACT

A circuit arrangement for generation of radio frequency output signals which form a broadband frequency ramp, with a reference oscillator, a phase detector, a loop filter, a VC oscillator for generating the output signals, a frequency divider, a step-down mixer and a local oscillator for generating a local oscillator signal. The reference oscillator, the phase detector, the loop filter, the VC oscillator, the frequency divider and the step-down mixer belong to a phase-locking loop. The frequency divider and the step-down mixer are in the feedback path of the phase-locking loop. The step-down mixer mixes the output signals and the local oscillator signal. The frequency of the output signal is adjustable by varying the division ratio of the frequency divider. Characteristics of the output signal are improved using the adjustable frequency of the local oscillator signal.

12 Claims, 5 Drawing Sheets

(56) References Cited

U.S. PATENT DOCUMENTS

| | | |
|---|---|---|
| 5,642,066 A | 6/1997 | Burke |
| 6,411,820 B1 * | 6/2002 | Margarit et al. ........... 455/553.1 |
| 7,835,706 B2 * | 11/2010 | Welland et al. ................. 455/76 |
| 7,898,344 B2 | 3/2011 | Hongo |

* cited by examiner

Fig. 1

(Prior Art)

CIRCUIT ARRANGEMENT FOR GENERATION OF RADIO FREQUENCY OUTPUT SIGNALS WHICH FORM A BROADBAND FREQUENCY RAMP

FIELD OF THE INVENTION

The invention relates to a circuit arrangement for generation of radio frequency output signals which form a broadband frequency ramp, with a reference oscillator, a phase detector, preferably a loop filter, a voltage-controlled oscillator (i.e., VC oscillator) for generating the output signals. A frequency divider, a step-down mixer and a local oscillator generate a local oscillator signal. The reference oscillator, the phase detector, optionally the loop filter, the VC oscillator, the frequency divider and the step-down mixer belong to a phase-locking loop. The frequency divider and the step-down mixer are in the feedback path of the phase-locking loop. The step-down mixer mixes the output signals and the local oscillator signal. The frequency of the output signal is adjustable by variation of the division ratio of the frequency divider.

BACKGROUND OF THE INVENTION

Circuit arrangements for generation of radio frequency output signals which form a broadband frequency ramp are commonly known (see, German Patent Applications DE 10065657 and DE 102004032130, and U.S. Pat. Nos. 5,642,066, and 7,898,344), as well as literature citations "A High Precision 24 GHz FMCW Radar Based on a Fractional-N ramp-PLL", IEEE TRANSACTIONS ON INSTRUMENTATION AND MEASUREMENT, Vol. 52, No. 2, April 2003, "SiGe Bipolar VCO with Ultra-Wide Tuning Range at 80 GHz Center Frequency", IEEE JOURNAL OF SOLID-STATE CIRCUITS, Vol. 44, No. 10, October 2009).

Circuit arrangements of the type under consideration are used for modem FMCW (frequency modulated continuous wave) radar systems for range finding and velocity measurements with high precision, resolution, and dynamics. The abbreviation FMCW comes from the English term frequency modulated continuous wave (compare Wikipedia "FMCW Radar").

For FMCW radar systems, circuit arrangements are required in which radio frequency output signals have periodically, linearly rising and/or falling frequencies. The radio frequency output signals of a circuit arrangement of the type under consideration in which frequency output signals have periodically, linearly rising and/or falling frequencies have been designated frequency ramp above and, hereinafter, are also designated frequency ramp.

For applications with high local resolution and good antenna focusing, frequency bands in the millimeter wave range have been standardized in recent years. For automobile applications, the frequency band from 76 GHz to 81 GHz had been released; and, for industrial level measurement, even a 10 GHz wide frequency band from 75 GHz to 85 GHz has been released.

Figure 1:
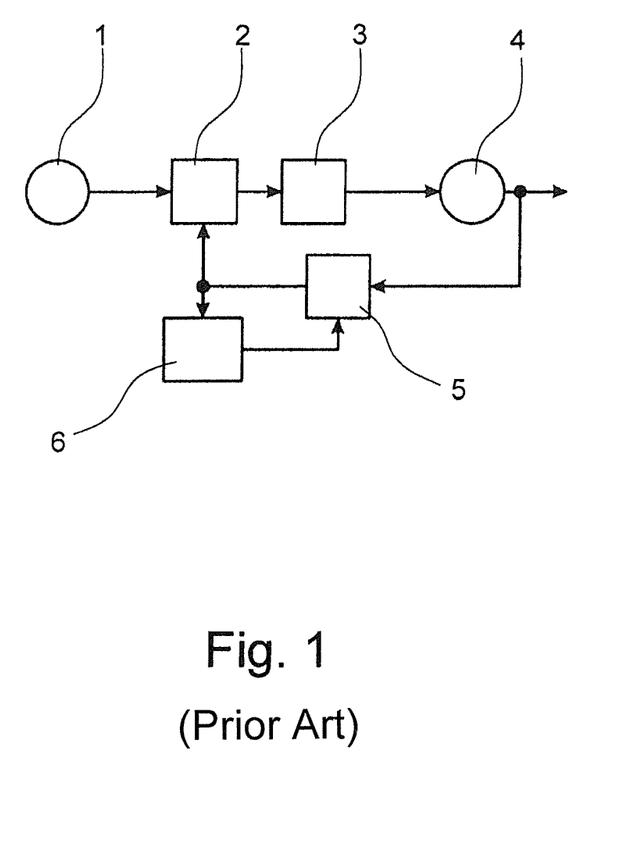
FIG. 1 shows a circuit arrangement of the type under consideration which belongs to the prior art, with a reference oscillator, a phase detector, a loop filter a voltage-controlled oscillator, a VC oscillator for generating the radio frequency output signals, a frequency divider and a control unit.

FIG. 1 shows a circuit arrangement of the type under consideration which belongs to the prior art, with a reference oscillator 1, a phase detector 2, a loop filter 3, a voltage-controlled oscillator (i.e., VC oscillator) 4 for generating the radio frequency output signals, a frequency divider 5, and a control unit 6.

Figure 2A:
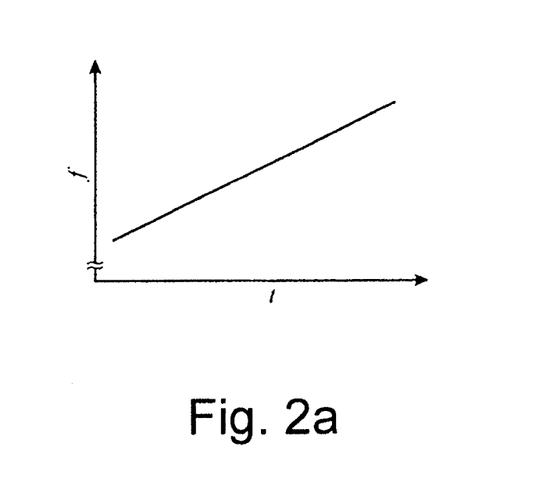
FIG. 2a shows the desired linear frequency ramp of the radio frequency output signals, therefore the frequency f of the output signals over time t.
Figure 2B:
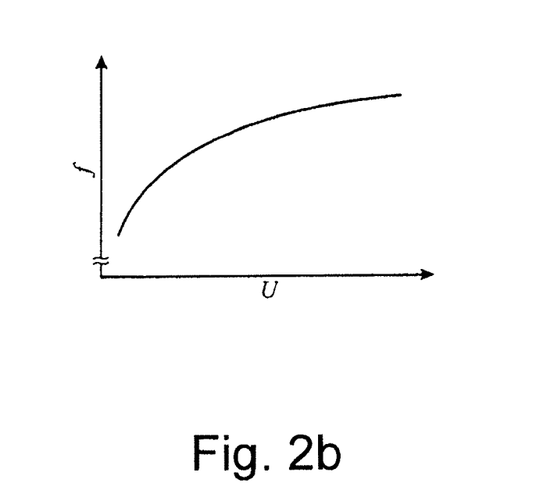
FIG. 2b shows a typical nonlinear variation of the tuning characteristic of a VC oscillator.

FIG. 2a shows the desired linear frequency ramp of the radio frequency output signals as a frequency f of the output signals over a time t. Conversely FIG. 2b shows a typical nonlinear variation of the tuning characteristic of a VC oscillator.

In the circuit arrangement which belongs to the prior art and which is shown in FIG. 1, the reference oscillator 1 is a crystal oscillator and the phase detector 2, the loop filter 3, the VC oscillator 4, the frequency divider 5 and the control unit 6 form a phase-locking loop (i.e., PLL). In the circuit arrangement shown in FIG. 1, a conventional, single-loop PLL is implemented. Assuming stable control with a loop filter 3, the difference phase of the two input signals on the phase detector 2 is adjusted to zero.

The reciprocal value of the division factor will be labeled N below. Therefore the output frequency on the frequency divider 5 corresponds to N-times the input frequency:

$$f_A = N \cdot f_E$$

To generate the frequency ramp, in the simplest case, the frequency divider 5 with each cycle is increased by one value by the control unit 6. A linearized frequency ramp results therefrom by the smoothing lowpass characteristics of the loop filter 3. The use of fractional divider factor sequences also allows variation by rational values and thus enables a further degree of freedom in the choice of the pitch of the frequency ramp and its duration.

The control and stability properties of the above addressed phase-locking loop will be examined using the ring gain.

For the phase detector 2, there is an average output voltage which, with a factor $K_{PD}$, is proportional to the phase difference of the two input signals, including the input signal coming from the reference oscillator 1 and the input signal coming from the frequency divider 5. The output voltage of the phase detector 2 is filtered in the loop filter 3 and supplied to the VC oscillator 4 as its input voltage. The VC oscillator 4 then delivers radio frequency output signals whose frequency from the input voltage, which corresponds to the output voltage coming from the phase detector 2, filtered by the loop filter 3. The relationship between the input voltage on the VC oscillator 4 and the frequency of the radio frequency output signals of the VC oscillator 4 is shown in FIG. 2b.

The relationship between the input voltage on the VC oscillator 4 and the frequency of the radio frequency output signals of the VC oscillator 4, linearized by a working frequency, can be described by a proportional factor $K_{VCO}$. For the VC oscillator 4, referenced to its output phase with $K_{VCO}$/s, an integral behavior arises. If the division factor of the frequency divider 5 in the phase-locking loop, therefore in the feedback path, is added, the ring gain of the entire control circuit is:

$$H_{ring}(s) = K_{PD} \cdot F(s) \cdot \frac{K_{VCO}}{s} \cdot \frac{1}{N}.$$

In order to be able to also control sudden frequency errors and, thus, linearly rising phase errors, the loop filter 3 must have a largely integral behavior. But, since the phase reserve is already reduced to 90° by the inherent integration of the VC oscillator 4, for the dimensioning of the loop filter 3 at the gain crossover frequency of the ring gain by phase-lifting elements the phase reserve must be increased. In this frequency range then in any case the loop filter 3 deviates from the integral behavior and, as a result of which control is poor, especially noise suppression of the input-side phase noise. For this reason, this frequency range with elevated phase reserve should only limit a narrow range around the gain crossover frequency; this is only possible when the ring gain within the frequency ramp is constant.

If the phase-locking loop is used to generate a frequency ramp by switching the division factor N in the feedback path, this causes a variation of the ring gain. On one hand, the division factor N directly enters into the ring gain, and on the other hand, the altered output frequency causes a change of the tuning steepness of the VC oscillator 4 (compare FIG. 2b). These two effects act unfavorably in the same direction and thus mutually reinforce each other. At low frequencies, the VC oscillator 4 according to FIG. 2b has the highest tuning steepness which is divided by the smallest value of the division factor N. Conversely, at high frequencies, a small tuning steepness is divided by a large division factor N. This can lead to a variation of the ring gain by more than a factor of 10:1.

In general it is possible to dimension the loop filter 3 such that even for a large variation of the ring gain the control is robust, in any case then curtailments must be tolerated in the other control properties, especially in the stabilization of the phase noise near the carrier.

The prior art discloses approaches which keep the ring gain constant by a nonlinear distortion of the input voltage on the VC oscillator 4. This can take place either by digital or analog circuits (see, U.S. Patent Application Publication 2008/0061891 and U.S. Pat. No. 5,642,066), as a result of which almost any nonlinear forms, depending on the selected PLL concept, can be compensated. In any case, very broadband frequency ramps also require VC oscillators with a very large tuning bandwidth, which can only be accomplished by a large tuning steepness. This large tuning steepness causes marginal interferences of the tuning voltage, and of the input voltage on the VC oscillator, like any digital or analog circuit inevitably causes, to induce modulation of the frequency of the radio frequency output signals so that in PLLs for broadband frequency ramps the path from the phase detector 2 to the VC oscillator 4 is very unfavorable for introducing additional circuits.

SUMMARY OF THE INVENTION

With consideration of what has been stated above, the object of the invention is to improve the circuit arrangement for generating radio frequency output signals which form a broadband frequency ramp underlying the invention in order to achieve a better linearity of the frequency of the radio frequency output signals.

The circuit arrangement of the invention, in which the aforementioned object is achieved, is first of all essentially characterized in that the characteristic of the output signal is improved using an adjustable frequency of the local oscillator.

The heart of the invention is a phase-locking loop in which in the feedback path has an inverted frequency position mixer as a step-down mixer that is introduced such that, in the ring gain of the phase-locking loop, the variations of the division factor are compensated with the tuning steepness of the VC oscillator. This enables stabilization of the VC oscillator in a very wide frequency range with good control properties. Good stabilization is necessary especially for use at high frequencies, therefore in the millimeter wave range, for example in the region of 80 GHz, due to the fundamentally poor noise properties of the VC oscillator 4.

In the circuit arrangement of the invention, the local oscillator can be voltage-controlled, and it can be equipped with a phase-locking loop.

According to another teaching of the invention the frequency of the local oscillator signal can be adjusted by a frequency divider with a variable division ratio in the feedback path of the phase-locking loop of the local oscillator. The phase-locking loop of the local oscillator can also have its own reference oscillator as a reference or can use the primarily necessary reference oscillator at the same time.

Otherwise in the circuit arrangement in accordance with the invention, the frequency of the local oscillator is preferably higher than the frequency of the input signal of the step-down mixer, therefore the frequency of the VC oscillator.

For the hardware implementation of circuit arrangements in accordance with the invention, it is recommended that the VC oscillator and the local oscillator be implemented as integrated circuits with integrated LC resonator elements. One embodiment is economical in that at least the VC oscillator and the local oscillator are implemented on the same chip. Moreover, it is recommended that the local oscillator be stabilized by an additional phase-locking loop.

The circuit arrangement underlying the invention and, consequently, the circuit arrangement in accordance with in the invention, as stated above, includes a frequency divider. But it can be recommended that the entire desired frequency divider ratio also be implemented by the frequency divider which is present anyway and an additional frequency prescaler between the VC oscillator and the step-down mixer.

If the VC oscillator and the local oscillator are implemented on the same chip, as stated above, and if there is additionally a frequency prescaler, it is recommended that the frequency prescaler be implemented on a chip on which the VC oscillator and the local oscillator are implemented. Finally, the step-down mixer can also be implemented on the chip on which the VC oscillator and the local oscillator, optionally also the frequency prescaler, are implemented.

The high-level integration which has been described as preferable above, on the one hand, minimizes the costs by a reduced number of interfaces and, on the other hand, enables a power-saving implementation in which the additional costs for the voltage supply and cooling are low keep, and enables applications with strictly limited energy budget. In particular in industrial measurement engineering the available electrical output is severely limited when using a 2-wire unit signal.

In particular, there are now a host of possibilities for embodying and developing the circuit arrangement in accordance with the invention. Reference is made in this respect to the exemplary embodiments which are shown in the drawings.

DETAILED DESCRIPTION OF THE INVENTION

Figure 3:
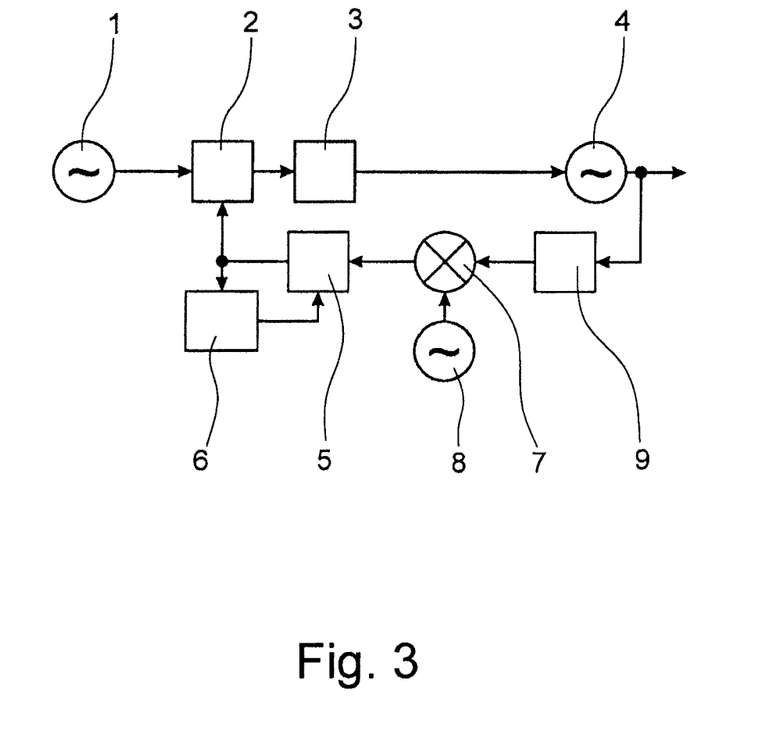
FIG. 3 schematically shows one preferred exemplary embodiment of one circuit arrangement in accordance with the invention for generation of radio frequency output signals which form a broadband frequency ramp.
Figure 4A:
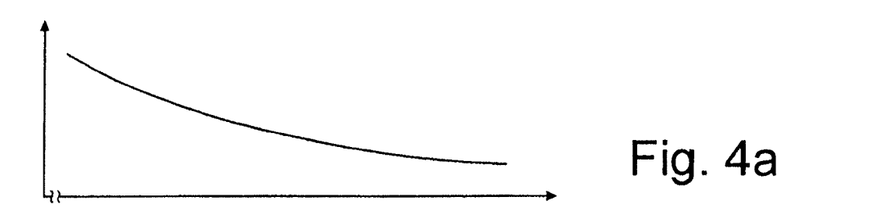
FIG. 4 shows a graphic representation in explanation of the principle underlying the invention.
Figure 4B:
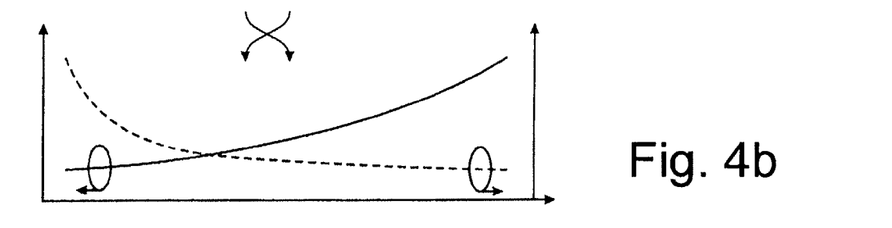
Figure 4C:
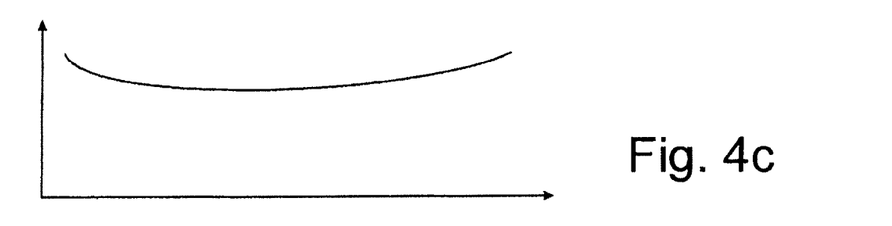
Figure 5:
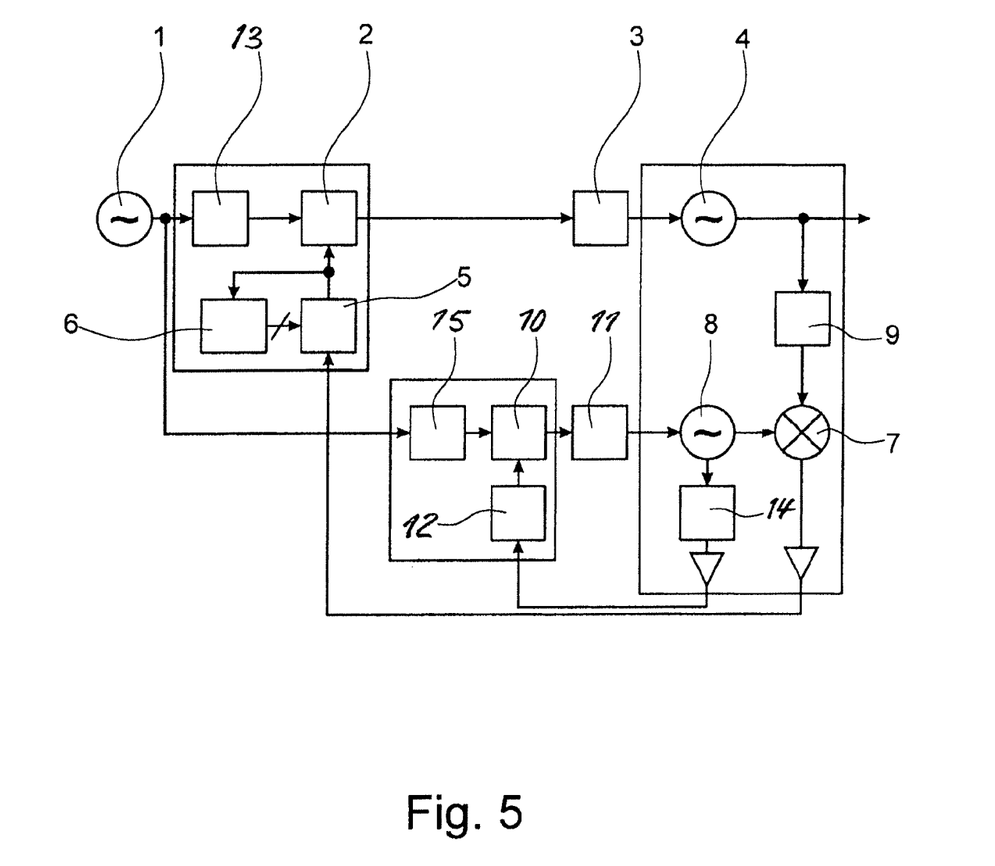
FIG. 5 again shows one preferred exemplary embodiment of a circuit arrangement for generating radio frequency output signals which form a broadband frequency ramp.

FIGS. 3 to 5 show preferred exemplary embodiments of circuit arrangements in accordance with the invention for generation of radio frequency output signals which form a broadband frequency ramp. These circuit arrangements include a reference oscillator 1, a phase detector 2, a loop filter 3, a voltage-controlled oscillator (i.e., a VC oscillator) 4 for generating the radio frequency output signals, a frequency divider 5 with an assigned control unit 6, with which the division factor N of the frequency divider 5 can be set, a step-down mixer 7 and a local oscillator 8 for generating a local oscillator signal. Here the phase-locking loop includes the reference oscillator 1, the phase detector 2, the loop filter 3, the VC oscillator 4, the frequency divider 5 and the step-down mixer 7. The frequency divider 5 and the step-down mixer 7 are in the feedback path of the phase-locking loop. The step-down mixer 7 mixes the output signal (of the VC oscillator 4) and the local oscillator signal. The frequency of the output signal of the output signal of the VC oscillator 4, is adjustable by variation of the division ratio of the frequency divider 5, specifically by means of the control unit 6.

The circuit arrangement in accordance with the invention is, first of all, essentially characterized in that using the adjustable frequency of the local oscillator signal, the characteristic of the output signal is improved, specifically, can be linearized.

For the exemplary embodiment in FIG. 3, it additionally applies that, in addition to the frequency divider 5, there is a frequency prescaler 9 between the VC oscillator 4 and the step-down mixer 7. If for example the circuit arrangement is dimensioned overall, such that the frequency of the output signal of the VC oscillator 4 is 80 GHz, it can be advantageous to implement the frequency prescaler 9 such that the output signal of the frequency prescaler 9 (i.e., the input signal of the step-down mixer 7) is only 20 GHz, and that ,without influencing by the step-down mixer 7, an output signal with 20 MHz is obtained from the input signal on the frequency divider 5 with 20 GHz. The "entire frequency divider" in the feedback path consists of the radio frequency fixed frequency prescaler 9 and the low frequency, programmable frequency divider 5.

In the exemplary embodiment as shown in FIG. 3, between the frequency prescaler 9 and the frequency divider 5 is the step-down mixer 7 which can be programmed by the control unit 6.

In general, mixers in phase-locking loops are often used since in this way the phase noise of the VC oscillator 4 near the carrier can be reduced. The conventional approach of a regular frequency position mixer, based on the larger relative change of the values of the frequency divider 5, would even greatly increase the variation of the ring gain in the phase-locking loop, for which reason in the circuit arrangement in accordance with the invention, a step-down mixer 7 is used in the inverted frequency position. The ring gain formula given above for a simple phase-locking loop remains in the linearized form given here. Only the division factor N need be replaced by the product of P and N. In any case, it must be considered that at this point for the high tuning steepness, therefore at small frequencies, there are large division factors so that a compensation effect occurs. The dimensioning of the frequency of the local oscillator signal remains as a degree of freedom for achieving an optimum compensation effect.

FIGS. 4a-4c show what has been achieved in accordance with the invention. FIG. 4a shows the tuning steepness of the VC oscillator 4 over the frequency which is reflected in the frequency by the step-down mixer 7 in the inverted frequency position; which is shown by FIG. 4b so that it has an opposite characteristic to the reciprocal value of the division factor. FIG. 4c shows a schematic of the resulting characteristic of the quotient of the tuning steepness and the feedback division factor with an optimum choice of the frequency of the local oscillator signal.

FIG. 5 shows an especially preferred exemplary embodiment of a circuit arrangement in accordance with the invention for generation of radio frequency output signals which form a broadband frequency ramp. In this exemplary embodiment, as in the exemplary embodiment as shown in FIG. 3, first of all, there are a reference oscillator 1, a phase detector 2, a loop filter 3, a voltage-controlled oscillator 4, a frequency divider 5, a control unit 6 which is assigned to the frequency divider 5, a step-down mixer 7, a local oscillator 8 and a frequency prescaler 9. With the exemplary embodiment of a circuit arrangement in accordance with the invention which is shown in FIG. 5, a highly linear frequency ramp with a bandwidth is achieved, as is not even approximately described in the literature.

In the exemplary embodiment as shown in FIG. 5, the local oscillator 8, like the VC oscillator 4, is voltage-controlled and is equipped with a phase-locking loop which includes a phase detector 10, a loop filter 11 and a frequency divider 12. The frequency prescaler 9, with a division factor of 4, reduces the working frequency of the step-down mixer 7 and of the local oscillator 8 such that its implementation with little effort is possible. The output frequencies 8 for stabilization of the VC oscillator 4 and of the local oscillator 8 are below 7 GHz so that the PLLs can be implemented with a wide choice of economical commercial PLL modules. For ramp generation, the frequency divider 5 in the PLL of the VC oscillator 4 is (fractionally) varied while the PLL of the local oscillator 8 works at a fixed frequency and can be operated for good phase noise with a high reference frequency.

Otherwise, in the exemplary embodiment as shown in FIG. 5 there are still other frequency dividers 13, 14, and 15 whose operation is easily apparent to one skilled in the art.

First laboratory models of the circuit arrangement in accordance with the invention have confirmed the function of the system concept and enabled stabilization of the VC oscillator 4 in almost its entire tuning range with a tuning bandwidth of more than 22 GHz with simultaneously good phase noise. In practice a reduction of the tuning range can be expected by temperature and production fluctuations. The variation of the ring gain is so low that it has been ignored in the design for the loop filter 3 so that it could be optimized for good phase noise. The implemented circuit arrangement had a current consumption of only 100 mA at a voltage supply of 5 V.

What is claimed is:

1. A circuit arrangement for generation of radio frequency output signals which form a broadband frequency ramp, the circuit arrangement comprising:
    a reference oscillator;
    a phase detector;
    a voltage-controlled (VC) oscillator that generates an output signal;
    a frequency divider;
    a step-down mixer; and
    a local oscillator that generates a local oscillator signal, wherein:
    the reference oscillator, the phase detector, the VC oscillator, the frequency divider and the step-down mixer are part of a phase-locking loop;
    the frequency divider and the step-down mixer are in a feedback path of the phase-locking loop;
    the step-down mixer mixes the output signal and the local oscillator signal;
    the frequency of the output signal is adjustable by variation of a division ratio of the frequency divider; and the step-down mixer is an inverted position mixer that is located in the feedback path of the phase-looking loop in a manner that compensates variations of the division ratio in the frequency divider with the tuning steepness of the VC oscillator.

2. The circuit arrangement as claimed in claim 1, wherein the local oscillator is voltage-controlled.

3. The circuit arrangement as claimed in claim 2, wherein the local oscillator is equipped with a respective phase-locking loop.

4. The circuit arrangement as claimed in claim 3, wherein the frequency of the local oscillator signal can be adjusted by a second frequency divider with a variable division ratio in the feedback path of the phase-locking loop of the local oscillator.

5. The circuit arrangement as claimed in claim 3, wherein the phase-locking loop of the local oscillator has its own reference oscillator as a reference or uses the primary reference oscillator at the same time.

6. The circuit arrangement as claimed in claim 1, wherein the frequency of the local oscillator signal is higher than the frequency of an input signal of the step-down mixer.

7. The circuit arrangement as claimed in claim 1, wherein the VC oscillator and the local oscillator are implemented as integrated circuits with integrated LC resonator elements.

8. The circuit arrangement as claimed in claim 1, wherein at least the VC oscillator and the local oscillator are implemented on the same chip.

9. The circuit arrangement as claimed in claim 1, wherein there is a frequency prescaler is between the VC oscillator and the step-down mixer.

10. The circuit arrangement as claimed in claim 8, wherein:
a frequency prescaler is also implemented on the same chip as the VC oscillator and the step-down mixer; and
the frequency prescaler is between the VC oscillator and the step-down mixer.

11. The circuit arrangement as claimed in claim 8, wherein the step-down mixer is also implemented on the same chip in addition.

12. The circuit arrangement of claim 1, wherein the phase detector is a loop filter.

* * * * *